(12) United States Patent
Yoon

(10) Patent No.: US 6,764,899 B2
(45) Date of Patent: Jul. 20, 2004

(54) METHOD FOR FABRICATING SEMICONDUCTOR DEVICE

(75) Inventor: Dong-Soo Yoon, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/612,941

(22) Filed: Jul. 7, 2003

(65) Prior Publication Data

US 2004/0029397 A1 Feb. 12, 2004

(30) Foreign Application Priority Data

Jul. 19, 2002 (KR) ........................................ 2002-42394

(51) Int. Cl.$^7$ ........................................ H01L 21/8242
(52) U.S. Cl. ........................ 438/240; 438/396; 438/785
(58) Field of Search ................................ 438/240, 396, 438/785

(56) References Cited

U.S. PATENT DOCUMENTS

| | | | |
|---|---|---|---|
| 5,002,730 A | 3/1991 | Fetcenko | |
| 5,122,477 A | * 6/1992 | Wolters et al. | 438/396 |
| 6,274,454 B1 | * 8/2001 | Katori | 438/240 |
| 6,498,714 B1 | 12/2002 | Fujisawa et al. | |
| 6,511,925 B1 | 1/2003 | Aronowitz et al. | |

OTHER PUBLICATIONS

Zhan et al., "Characteristics of High Quality Hafnium oxide Gate dielectric", Electron Devices Meeting, 2002., IEEE Hong Kong, Jun. 22, 2002, pp. 43–46.*

* cited by examiner

Primary Examiner—Kamand Cuneo
Assistant Examiner—Lisa Kilday
(74) Attorney, Agent, or Firm—Jacobson Holman PLLC

(57) ABSTRACT

The present invention is related to a method for forming a hydrogen barrier layer capable of protecting a bottom structure from damages occurring due to hydrogen produced during a semiconductor device fabrication. The method includes the steps of: forming a hafnium vanadium oxide (HfVO$_x$) layer on a substrate structure providing a predetermined semiconductor device structure, the HfVO$_x$ layer being used as a hydrogen diffusion barrier layer; and forming an insulation layer on the HfVO$_x$ layer.

12 Claims, 2 Drawing Sheets

METHOD FOR FABRICATING SEMICONDUCTOR DEVICE

FIELD OF THE INVENTION

The present invention relates to a method for fabricating a semiconductor device; and, more particularly, to a method for forming a hydrogen diffusion barrier layer in a semiconductor device.

DESCRIPTION OF RELATED ARTS

In a semiconductor device, an insulation layer for insulating a bottom structure and a top structure can be classified into an inter-layer insulation layer, an inter-metal insulation layer and a passivation layer.

In an insulation layer formation process, plasma and source gas including hydrogen are typically used. Thus, hydrogen atoms, ions and molecules are diffused into a previously formed bottom structure, particularly into a dielectric thin layer of a capacitor, and this diffusion results in degradation of dielectric material properties. Accordingly, a diffusion barrier layer against hydrogen produced when forming an insulation layer is formed prior to forming the insulation layer.

Figure 1:
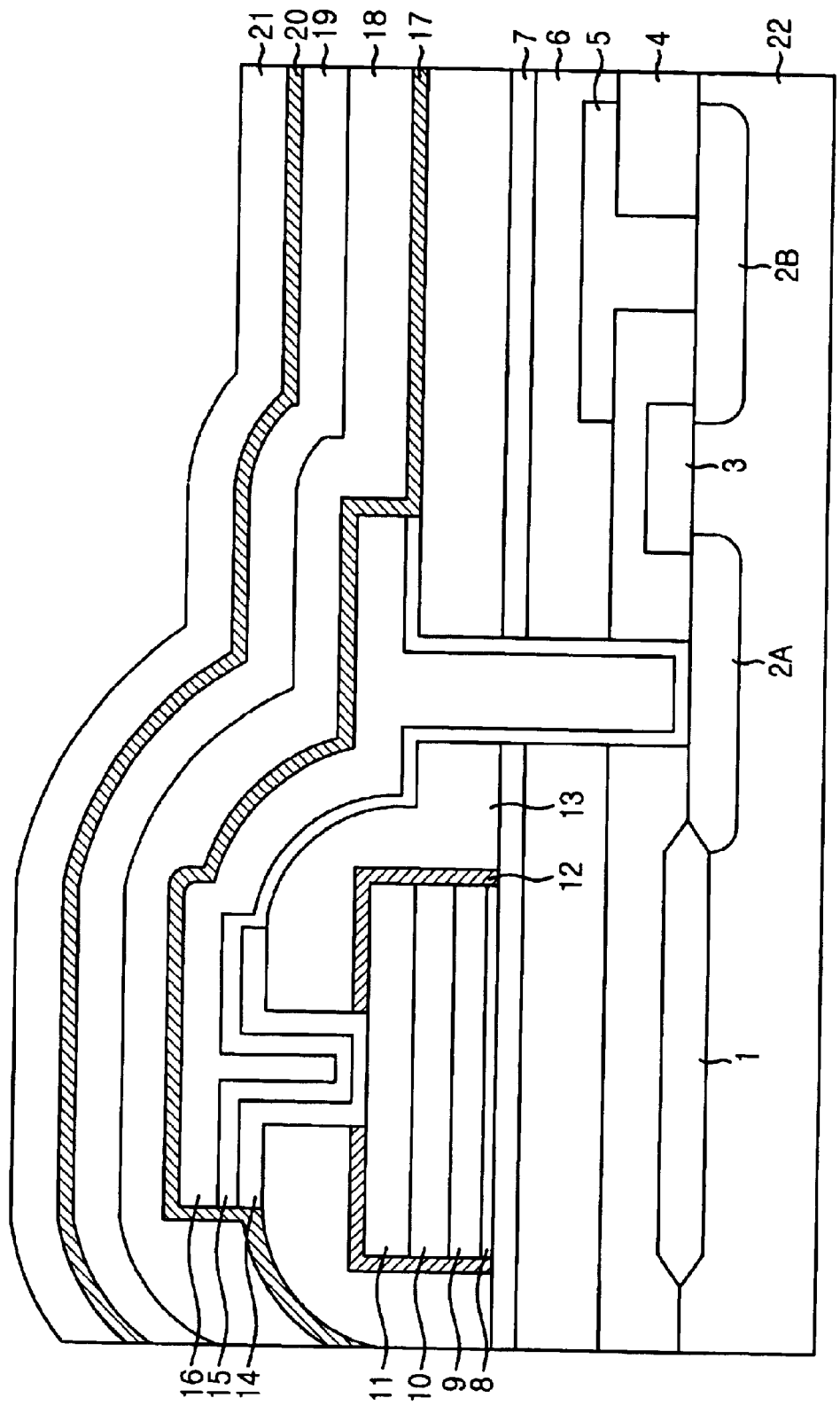

FIG. 1 is a cross-sectional view showing a conventional method for fabricating a semiconductor device.

As shown, a first inter-layer insulation layer 4 is formed on a substrate 22 providing a first and a second active regions 2A and 2B, a device isolation layer 1 and a gate pattern 3. Then, the first inter-layer insulation layer 4 is selectively removed to form a bit line 5 connected to the second active region 2B formed on one side of the gate pattern 3.

A second inter-layer insulation layer 6 is formed on the first inter-layer insulation layer 4, and an insulation layer 7 for passivation is formed thereon.

Subsequent to the second inter-layer insulation layer 6 formation, an adhesion layer 8 for adhering a lower electrode 9 to the second inter-layer insulation layer 6 is formed on a region where a capacitor will be formed. On top of the adhesion layer 8, the capacitor including the lower electrode 9, a dielectric thin layer 10 and an upper electrode 11 is formed. After forming the capacitor, a first diffusion barrier layer 12 for preventing diffusions of hydrogen produced during a subsequent insulation layer formation process is formed in such a manner that it encompasses the capacitor.

Next, a third inter-layer insulation layer 13 is formed, and a contact hole exposing the upper electrode 11 and another contact hole exposing the first active region 2A formed on the other side of the gate pattern 3 are formed thereafter.

Afterwards, a ferroelectric passivation layer 14 for protecting the upper electrode 11 of the capacitor and a barrier metal layer 15 are formed. A first metal line 16 connecting the upper electrode 11 to the first active region 2A is formed thereon. A second diffusion barrier layer 17 for preventing diffusions of hydrogen is formed on an entire surface of the substrate 22 so as to encompass the previously formed structure.

A third diffusion barrier layer 18 is formed on the second diffusion barrier layer 17, and a second metal line 19 is formed thereon. On top of the second metal line 19, a forth diffusion barrier layer 20 and a passivation layer 21 are sequentially formed.

The above first to third diffusion barrier layers 12, 17 and 20 are the diffusion barrier layer against hydrogen and usually use $Al_2O_3$ or $TiO_2$ insulation layer. However, this type of insulation layer cannot completely prevent the hydrogen diffusion.

Also, hydrogen in an atom, molecule or plasma state used during the insulation formation process shocks the bottom structure, and this shock effect becomes a critical factor affecting a functional decrease of a semiconductor device.

SUMMARY OF THE INVENTION

It is, therefore, an object of the present invention to provide a hydrogen diffusion barrier layer capable of preventing a bottom structure from damage occurring due to hydrogen produced during a semiconductor device fabrication process.

In accordance with an aspect of the present invention, there is provided a method for fabricating a semiconductor device including the steps of: forming a hafnium vanadium oxide ($HfVO_x$) layer on a substrate providing a predetermined structure, the $HfVO_x$ layer being used as a hydrogen diffusion barrier layer; and forming an insulation layer on the $HfVO_x$ layer.

BRIEF DESCRIPTION OF THE DRAWING(S)

Figure 2:
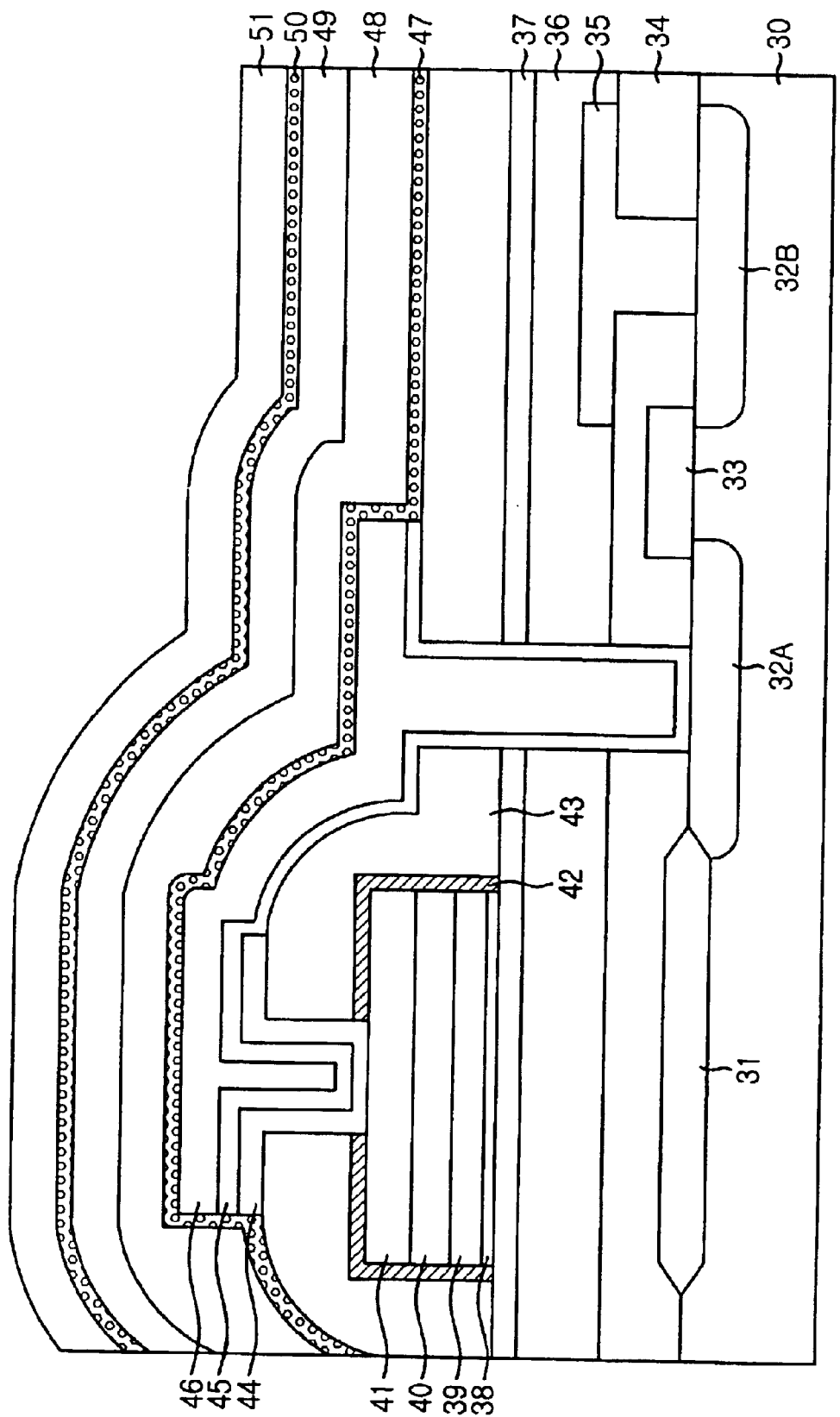

The above and other objects and features of the present invention will become apparent from the following description of the preferred embodiments given in conjunction with the accompanying drawings, in which:

FIG. 1 is a cross-sectional view showing a conventional method for fabricating a semiconductor device; and FIG. 2 is a cross-sectional view showing a method for forming a capacitor of a semiconductor device in accordance with a preferred embodiment of the present invention.

DETAILED DESCRIPTION OF THE INVENTION

FIG. 2 is a cross-sectional view showing a method for forming a capacitor of a semiconductor device in accordance with a preferred embodiment of the present invention.

Referring to FIG. 2, a first inter-layer insulation layer 34 is formed on a substrate 30 providing a first and a second active regions 32A and 32B, a device isolation layer 31 and a gate pattern 33. Then, the first inter-layer insulation layer 34 is selectively removed to form a bit line 35 connected to the second active region 32B formed on one side of the gate pattern 33.

A second inter-layer insulation layer 36 is formed on the first inter-layer insulation layer 34, and a passivation layer 37 is formed thereon by using silicon oxide.

Subsequent to the passivation layer 37 formation, an adhesion layer 38 for adhering a lower electrode 39 to the second inter-layer insulation layer 36 is formed on a region where a capacitor will be formed. On top of the adhesion layer 38, the capacitor including the lower electrode 39, a dielectric thin layer 40 and an upper electrode 41 is formed. After forming the capacitor, a first diffusion barrier layer 42 for preventing diffusions of hydrogen produced during a subsequent insulation layer formation process is formed in such a manner that it encompasses the capacitor.

Herein, the first diffusion barrier layer 42 uses a hafnium vanadium oxide ($HfVO_x$) layer and is deposited through the use of a physical vapor deposition (CVD) technique. The $HfVO_x$ layer is a highly densified layer formed by adding vanadium to a basis material, hafnium oxide, which is denser than alumina and titanium oxide.

As well known, hydrogen has a very high diffusion rate. Thus, it is necessary to have a micronized structure, which is dense, and a capability to store hydrogen in order to suppress diffusions of hydrogen. The $HfVO_x$ layer has an excellent property of suppressing the hydrogen diffusion because it is capable of storing hydrogen at a relatively high temperature, e.g., at about 500° C.

Next, a third inter-layer insulation layer 43 is formed, and a contact hole exposing the upper electrode 41 and another contact hole exposing the first active region 32A formed on the other side of the gate pattern 33 are formed.

Afterwards, a ferroelectric passivation layer 44 for protecting the upper electrode 41 of the capacitor and a barrier metal layer 45 are formed. A first metal line 46 connecting the upper electrode 41 to the first active region 32A is formed thereon. A second diffusion barrier layer 47 for preventing the hydrogen diffusion is formed on an entire surface of the substrate 30 so as to encompass the previously formed structure.

A third diffusion barrier layer 48 is formed on the second diffusion barrier layer 47, and a second metal line 49 is formed thereon. On top of the second metal line 49, a forth diffusion barrier layer 50 and a passivation layer 51 are sequentially formed.

In accordance with the preferred embodiment of the present invention, it is possible to form a hydrogen diffusion barrier layer capable of effectively preventing diffusions of hydrogen produced during an insulation layer formation process after forming a capacitor. As a result of this effective prevention of the hydrogen diffusion, reliability and electric properties of a semiconductor device have been improved.

A deposition process and a densification process of the $HfVO_x$ layer used as the hydrogen diffusion barrier layer will be explained in more detail in the following.

The $HfVO_x$ layer is deposited through a PVD technique carried out at a temperature ranging from about 100° C. to about 900° C. by using a reaction gas produced from the reaction between Hf and V targets. The deposition thickness ranges from about 200 Å to about 1000 Å. Also, the Hf, V and O have composition ratios of about 50 to 90 at %, about 10 to 50 at % and about 1 to 80 at %, respectively.

In order to densify the $HfVO_x$ layer, oxygen can be additionally filled up. At this time, the oxygen filling-up procedure is proceeded through a rapid thermal annealing process carried out at a temperature ranging from about 100° C. to about 650° C. for about 1 to 5 minutes in an atmosphere of oxygen.

Also, it is still possible to carry out a rapid thermal annealing process at a temperature ranging from about 100° C. to about 650° C. for about 1 to 5 minutes in an atmosphere of Ar and $O_2$ or $N_2$ and $O_2$.

In order to densify the diffusion barrier layer and obtain a uniform surface filling-up of the diffusion barrier layer, it is further possible to use ionized oxygen, which is accelerated at the same temperature above for about 1 to 5 minutes by an electric field generated around the substrate 30.

In addition, Ar presents within a chamber is ionized or Ar and oxygen are simultaneously ionized and this ionized Ar or Ar and Oxygen gets to hit the deposited diffusion barrier layer for densification. Afterwards, a uniform oxide layer is formed with use of oxygen ions. At this time, this process is proceeded also at a temperature of about 100° C. to about 650° C. for about 1 to 5 minutes.

It is also possible to ionize nitrogen within a chamber or ionize nitrogen and oxygen simultaneously, and then, this ionized nitrogen or nitrogen and oxygen gets to hit the diffusion barrier layer for densification. Thereafter, oxygen ions are used to form a uniform oxide layer. Also, this process is carried out under the same condition of the above temperature and duration time.

It is further possible to perform a heat treatment with $NH_4$ or with $NH_4$ plasma so that a uniform oxide layer is formed under the same condition of the above temperature and duration time.

$NH_4$ plasma, Oxygen plasma or UV ozone can be used in addition to the aforementioned ones. Furthermore, it is possible to reform the surface of the diffusion barrier layer through combinations of the above methods.

By following the preferred embodiment of the present invention, there is provided an effect of improving reliability by preventing hydrogen diffusions into a bottom structure during a semiconductor device fabrication process.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:
    forming a hafnium vanadium oxide ($HfVO_x$) layer on a substrate structure providing a predetermined semiconductor device structure, the $HfVO_x$ layer being used as a hydrogen diffusion barrier layer; and
    forming an insulation layer on the $HfVO_x$ layer.

2. The method as recited in claim 1, wherein the predetermined structure includes a capacitor.

3. The method as recited in claim 1, wherein the $HfVO_x$ layer is deposited through a physical vapor deposition technique.

4. The method as recited in claim 3, wherein the $HfVO_x$ layer is deposited to a thickness ranging from about 200 Å to about 1000 Å.

5. The method as recited in claim 3, wherein the $HfVO_x$ layer is deposited at a temperature ranging from about 100° C. to about 900° C.

6. The method as recited in claim 1, further comprising the step of performing a rapid thermal annealing process carrying out at a temperature ranging from about 100° C. to about 650° C. for about 1 to 5 minutes in order to densify a surface of the $HfVO_x$ layer.

7. The method as recited in claim 1, further comprising the step of performing a rapid thermal annealing process at a temperature around 100° C. to about 650° C. for about 1 to 5 minutes in an atmosphere of Ar and $O_2$ or $N_2$ and $O_2$ in order to densify a surface of the $HfVO_x$ layer.

8. The method as recited in claim 1, further comprising the step of ionizing oxygen and accelerating the ionized oxygen with use of an electric field generated around a substrate in order to densify a surface of the $HfVO_x$ layer, wherein the acceleration is proceeded at a temperature of about 100° C. to about 650° C. for about 1 to 5 minutes.

9. The method as recited in claim 1, further comprising the step of ionizing Ar or Ar and Oxygen simultaneously and getting this ionized Ar or Ar and Oxygen to hit the $HfVO_x$ layer in order to densify a surface of the $HfVO_x$ layer, wherein the hitting procedure is proceeded at a temperature of about 100° C. to about 650° C. for about 1 to 5 minutes.

10. The method as recited in claim 1, further comprising the step of ionizing nitrogen or nitrogen and oxygen simultaneously and getting this ionized nitrogen or nitrogen and oxygen to hit the $HfVO_x$ layer in order to densify a surface of the $HfVO_x$ layer, wherein the hitting procedure is proceeded at a temperature of about 100° C. to about 650° C. for about 1 to 5 minutes.

11. The method as recited in claim 1, further comprising the step of performing a heat treatment with $NH_4$ or $NH_4$ plasma to the $HfVO_x$ layer at a temperature of about 100° C. to about 650° C. for about 1 to 5 minutes and then forming a uniform oxide layer with use of oxygen so as to densify a surface of the $HfVO_x$ layer.

12. The method as recited in claim 1, further comprising the step of performing a heat treatment with $NH_4$ plasma, Oxygen plasma or UV ozone at a temperature of about 100° C. to about 650° C. for about 1 to 5 minutes and then forming a uniform oxide layer with use of oxygen so as to densify a surface of the $HfVO_x$ layer.

* * * * *